(12) United States Patent
Lu et al.

(10) Patent No.: US 12,046,293 B2
(45) Date of Patent: Jul. 23, 2024

(54) MEMORY DEVICE AND METHOD FOR OPERATING SELECTIVE ERASE SCHEME

(71) Applicant: MACRONIX INTERNATIONAL CO., LTD., Hsinchu (TW)

(72) Inventors: Chun-Chang Lu, Hsinchu (TW); Wen-Jer Tsai, Hualien (TW); Wei-Liang Lin, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 159 days.

(21) Appl. No.: 17/820,906

(22) Filed: Aug. 19, 2022

(65) Prior Publication Data
US 2024/0062825 A1   Feb. 22, 2024

(51) Int. Cl.
| | |
|---|---|
| *G11C 16/16* | (2006.01) |
| *G11C 16/04* | (2006.01) |
| *G11C 16/10* | (2006.01) |
| *G11C 16/26* | (2006.01) |
| G11C 16/24 | (2006.01) |
| G11C 16/34 | (2006.01) |

(52) U.S. Cl.
CPC .......... *G11C 16/16* (2013.01); *G11C 16/0483* (2013.01); *G11C 16/10* (2013.01); *G11C 16/26* (2013.01); *G11C 16/24* (2013.01); *G11C 16/344* (2013.01)

(58) Field of Classification Search
CPC ....... G11C 16/14; G11C 16/16; G11C 16/344; G11C 16/0483
See application file for complete search history.

(56) References Cited

U.S. PATENT DOCUMENTS

| | | | |
|---|---|---|---|
| 10,892,026 B2 | 1/2021 | Lin et al. | |
| 2014/0169093 A1* | 6/2014 | Parat | G11C 16/16 365/185.11 |
| 2016/0267995 A1* | 9/2016 | Chang | G11C 16/0475 |
| 2020/0357472 A1* | 11/2020 | Liu | G06F 12/0246 |
| 2021/0232311 A1* | 7/2021 | Peter | G06F 3/0673 |
| 2022/0270703 A1* | 8/2022 | Chandramani | G11C 16/102 |
| 2022/0415398 A1* | 12/2022 | Lien | G11C 16/08 |

FOREIGN PATENT DOCUMENTS

TW       1649754 B       2/2019

\* cited by examiner

*Primary Examiner* — Mushfique Siddique
(74) *Attorney, Agent, or Firm* — McClure, Qualey & Rodack, LLP

(57) ABSTRACT

A memory device and a method for operating selective erase scheme are provided. In an erase operation, a switch voltage is applied to at least one of a string select line or a ground select line of a selected sub-block of a selected block, a gate control voltage is applied to selected word lines of the selected sub-block, and an erase voltage is applied to bit lines and a common source line of the selected sub-block. The switch voltage is smaller than the erase voltage. The gate control voltage is smaller than the switch voltage and the erase voltage.

20 Claims, 7 Drawing Sheets

MEMORY DEVICE AND METHOD FOR OPERATING SELECTIVE ERASE SCHEME

TECHNICAL FIELD

This disclosure relates to a memory device and a method for operating the same.

BACKGROUND

Various operations are performed in memory devices. For example, in a NAND flash memory, a garbage collection process may be performed automatically to release the memory space. Data is written to a NAND flash memory in units called pages. However, the NAND flash memory is erased typically in larger units called blocks. If the data in some of the pages of a block are no longer needed, in order to release the memory space, the pages with valid data in the block are read and rewritten into a free block, and then the whole block can be erased. As such, the space of the block can be released for new data, so as to keep the writing efficiency of the NAND flash memory.

With the increase of the density for 3D NAND flash memory, the number of pages per block increases. Since all of the pages with valid data in the block to be erased are needed to be copied to the free block during a garbage collection process, the write-amplification is increased as the number of pages per block increases. The increased write-amplification may shorten the lifetime of memory cells. In addition, the garbage collection duration increases, in turn increasing the access latency for the read and write I/O requests, thereby degrading the overall performance significantly.

SUMMARY

In this disclosure, various operations for memory devices are improved.

According to some embodiments, a memory device is provided. The memory device comprises a plurality of planes each comprising a plurality of blocks. Each of the blocks comprises sub-blocks. Each of the sub-blocks comprises a string select line, a ground select line, a plurality of word lines, a plurality of strings, a plurality of bit lines, and a common source line. The word lines are between the string select line and the ground select line. The strings are across the string select line, the word lines, and the ground select line. The bit lines are connected to the strings at a string select line side. The common source line is connected to the strings at a ground select line side. The sub-blocks of a block share the bit lines, the word lines, and the common source line. In an erase operation, a switch voltage is applied to at least one of the string select line or the ground select line of a selected sub-block of a selected block, a gate control voltage is applied to selected word lines of the selected sub-block, and an erase voltage is applied to the bit lines and a common source line of the selected sub-block, wherein the switch voltage is smaller than the erase voltage, and the gate control voltage is smaller than the switch voltage and the erase voltage.

According to some embodiments, a method for operating a memory device is provided. The method comprises an erase operation. The erase operation comprises: applying a switch voltage to at least one of a string select line or a ground select line of a selected sub-block of a block; applying a gate control voltage to selected word lines of the selected sub-block; and applying an erase voltage to bit lines and a common source line of the selected sub-block. The switch voltage is smaller than the erase voltage. The gate control voltage is smaller than the switch voltage and the erase voltage.

Figure 1:
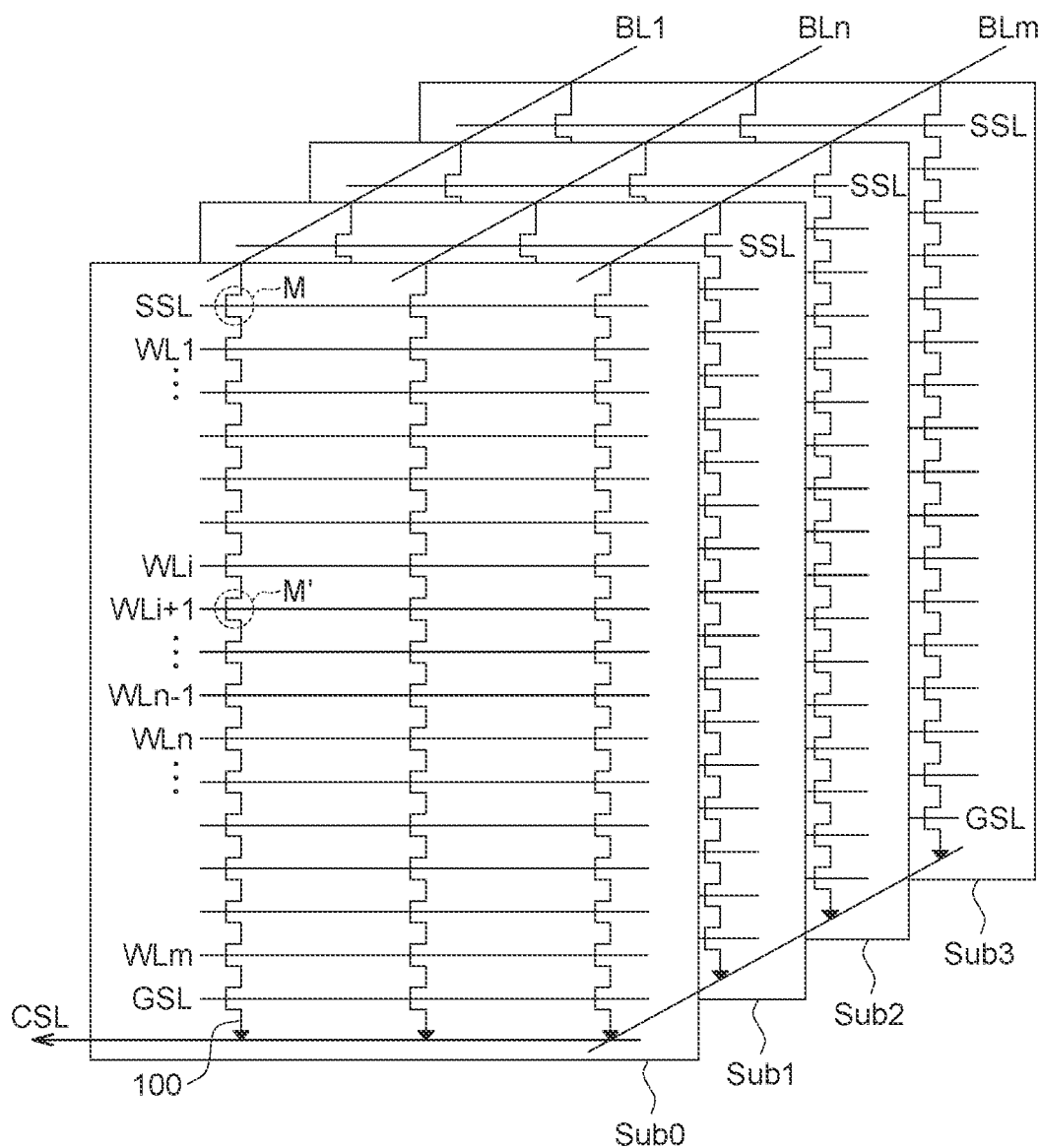
FIG. 1 illustrates an exemplary block of a memory device according to embodiments.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Various embodiments will be described more fully hereinafter with reference to accompanying drawings. The description and the drawings are provided for illustrative only, and not intended to result in a limitation. For clarity, the elements may not be drawn to scale. In addition, some elements and/or reference numerals may be omitted from some drawings. It is contemplated that the elements and features of one embodiment can be beneficially incorporated in another embodiment without further recitation.

One aspect of the disclosure relates to a memory device. The memory device comprises a plurality of planes each comprising a plurality of blocks. Each of the blocks comprises sub-blocks. Each of the sub-blocks comprises a string select line, a ground select line, a plurality of word lines, a plurality of strings, a plurality of bit lines, and a common source line. The word lines are between the string select line and the ground select line. The strings are across the string select line, the word lines, and the ground select line. The bit lines are connected to the strings at a string select line side. The common source line is connected to the strings at a ground select line side. The sub-blocks of a block share the bit lines, the word lines, and the common source line. In an erase operation, a switch voltage is applied to at least one of the string select line or the ground select line of a selected sub-block of a selected block, a gate control voltage is applied to selected word lines of the selected sub-block, and an erase voltage is applied to the bit lines and the common source line of the selected sub-block, wherein the switch voltage is smaller than the erase voltage, and the gate control voltage is smaller than the switch voltage and the erase voltage.

More specifically, referring to FIG. 1, an exemplary block is illustrated. Each block may comprise four or more sub-blocks. For example, four sub-blocks Sub0, Sub1, Sub2, and Sub3 are shown in FIG. 1. The sub-block Sub0 comprises a string select line SSL, a ground select line GSL, a plurality of word lines WL1 . . . WLm, a plurality of strings 100, a plurality of bit lines BL1 . . . BLm, and a common source line CSL. The word lines WL1 . . . WLm are between the string select line SSL and the ground select line GSL. The strings 100 are across the string select line SSL, the word lines WL1 . . . WLm, and the ground select line GSL. The bit lines BL1 . . . BLm are disposed at the string select line side and connected to the strings. The common source line CSL is disposed at the ground select line side and connected to the strings. According to some embodiments, the word lines of each of the sub-blocks may comprises a first group of word lines and a second group of word lines separated from each other by a group of dummy word lines. For example, the sub-block Sub0 may comprise dummy word lines WLi+1 . . . WLn−1. The word lines WL1 . . . WLi belong to the first group of word lines, the word lines WLn . . . WLm belong to the second group of word lines, and the two groups of word lines are separated from each other by the group of dummy word lines WLi+1 . . . WLn−1. The first group of word lines WL1 . . . WLi is between the string select line SSL and the group of dummy word lines WLi+1 . . . WLn−1. The second group of word lines WLn . . . WLm is between the ground select line and the group of dummy word lines WLi+1 . . . WLn−1. Memory cells M may be defined at cross points of the word lines WL1 . . . WLi and WLn . . . WLm and the strings 100. Dummy memory cells M' may be defined at cross points of the dummy word lines WLi+1 . . . WLn−1 and the strings 100. A total number of the word lines WL1 . . . WLi and WLn . . . WLm and the dummy word lines WLi+1 . . . WLn−1 may be 90 or more. The sub-blocks Sub1, Sub2, and Sub3 may be arranged in a similar manner to the sub-block Sub0. The sub-blocks Sub0, Sub1, Sub2, and Sub3 share the bit lines BL1 . . . BLm, the word lines WL1 . . . WLm, and the common source line CSL. However, each of the sub-blocks Sub0 to Sub3 can be independently selected by the SSL decoder and the GSL decoder.

According to some embodiments, in the erase operation, the whole selected sub-block is to be erased, and the switch voltage is applied to both the string select line SSL and the ground select line GSL of the selected sub-block, and the erase voltage is applied to the string select lines SSL and the ground select lines GSL of deselected sub-blocks of the selected block.

According to some other embodiments, in the erase operation, only pages corresponding to the first group of word lines WL1 . . . WLi of the selected sub-block is to be erased, the switch voltage is applied to the string select line SSL of the selected sub-block, the erase voltage is applied to the ground select line GSL of the selected sub-block, the erase voltage is applied to the second group of word lines WLn . . . WLm, gradient voltages from the erase voltage to the gate control voltage are applied to the group of dummy word lines WLi+1 . . . WLn−1 from a side of the group of dummy word lines WLi+1 . . . WLn−1 close to the second group of word lines WLn . . . WLm to a side of the group of dummy word lines WLi+1 . . . WLn−1 close to the first group of word lines WL1 . . . WLi, the gate control voltage is applied to the first group of word lines WL1 . . . WLi, and the erase voltage is applied to the string select lines SSL and the ground select lines GSL of deselected sub-blocks of the selected block.

According to still some other embodiments, in the erase operation, only pages corresponding to the second group of word lines WLn . . . WLm of the selected sub-block is to be erased, the switch voltage is applied to the ground select line GSL of the selected sub-block, the erase voltage is applied to the string select line SSL of the selected sub-block, the erase voltage is applied to the first group of word lines WL1 . . . WLi, gradient voltages from the erase voltage to the gate control voltage are applied to the group of dummy word lines WLi+1 . . . WLn−1 from a side of the group of dummy word lines WLi+1 . . . WLn−1 close to the first group of word lines WL1 . . . WLi to a side of the group of dummy word lines WLi+1 . . . WLn−1 close to the second group of word lines WLn . . . WLm, the gate control voltage is applied to the second group of word lines WLn . . . WLm, and the erase voltage is applied to the string select lines SSL and the ground select lines GSL of deselected sub-blocks of the selected block.

According to some embodiments, in an inter-plane mapping procedure, sub-blocks from physical blocks of different planes are mapped to a logical block such that the logical block is consisted of the sub-blocks from the different planes. According to some embodiments, in a write operation, the inter-plane mapping procedure may be performed, and the logical block is written. According to some embodiments, in a read operation, the inter-plane mapping procedure may be performed, and the logical block is read. According to some embodiments, in a garbage collection process, the inter-plane mapping procedure and the erase operation as described above may be performed.

Another aspect of the disclosure relates to a method for operating a memory device. The method comprises an erase operation. The erase operation comprises: applying a switch voltage to at least one of a string select line or a ground select line of a selected sub-block of a block; applying a gate control voltage to selected word lines of the selected sub-block; and applying an erase voltage to bit lines and a common source line of the selected sub-block. The switch voltage is smaller than the erase voltage. The gate control voltage is smaller than the switch voltage and the erase voltage.

Here, for convenience of understanding, it is assumed that the sub-block Sub0 is the selected sub-block to be erased or performed other operations. However, it can be appreciated that any other sub-block Sub1, Sub2, or Sub3 may be erased or performed other operations in a similar manner.

Figure 2:
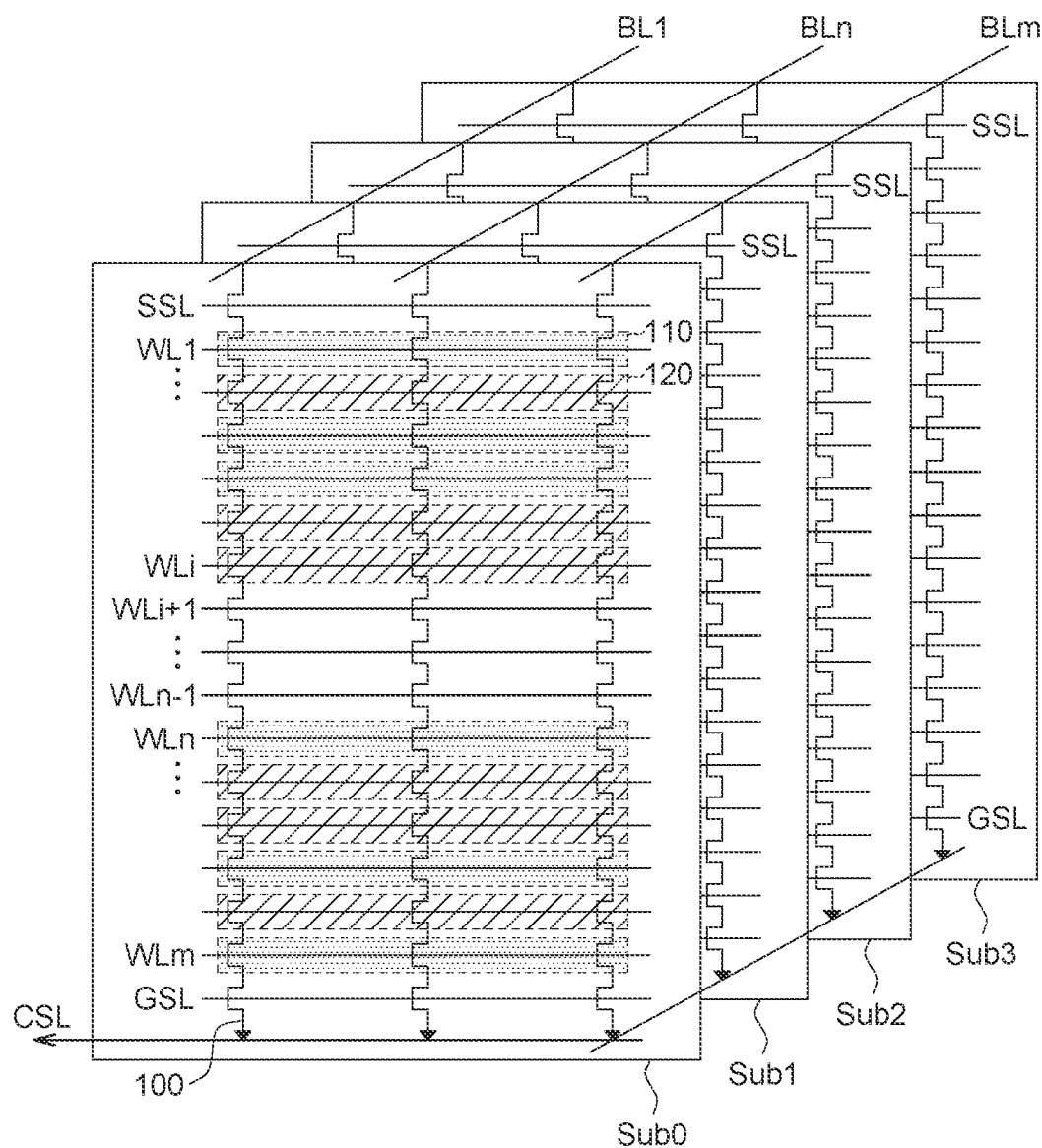
FIG. 2 illustrates an exemplary erase operation of a method for operating a memory device according to embodiments.

Referring to FIG. 2, an exemplary erase operation is illustrated. In the block as shown in FIG. 2, the whole selected sub-block Sub0 is to be erased. For example, the invalid pages are indicated by boxes 110 with dot shading, and the valid pages are indicated by boxes 120 with slash shading. The erase operation comprises: applying the switch voltage to both the string select line SSL and the ground select line GSL of the selected sub-block Sub0. In addition, the erase operation comprises: applying the gate control voltage is to all of the word lines WL1 . . . WLm (including the dummy word lines) of the selected sub-block Sub0; applying the erase voltage to the bit lines BL1 . . . BLm and the common source line CSL of the selected sub-block Sub0; and applying the erase voltage to the string select lines and ground select lines of deselected sub-blocks Sub1, Sub2, and Sub3 of the block. Since the switch voltage is applied to the sub-block Sub0 from both the string select line side and the ground select line side, the whole sub-block Sub0 is selected, and the erase operation can be performed on the whole sub-block Sub0. At the same time, the erase voltage is applied at both sides of the sub-blocks Sub1, Sub2, and Sub3, and thus the sub-blocks Sub1, Sub2, and Sub3 are not selected and will not be erased. As such, the erase operation can be performed on only one sub-block rather than the whole block. The number of the valid pages needed to be copied to a free block can be significantly reduced.

According to some embodiments, the switch voltage is smaller than the erase voltage by 5 V to 15 V, such as by about 10V. In some embodiments, the erase voltage may be about 20 V to 24 V, and the switch voltage may be about 5 V to 15 V. According to some embodiments, the gate control voltage is a zero voltage or a positive bias, the value of which is determined as needed.

Figure 3:
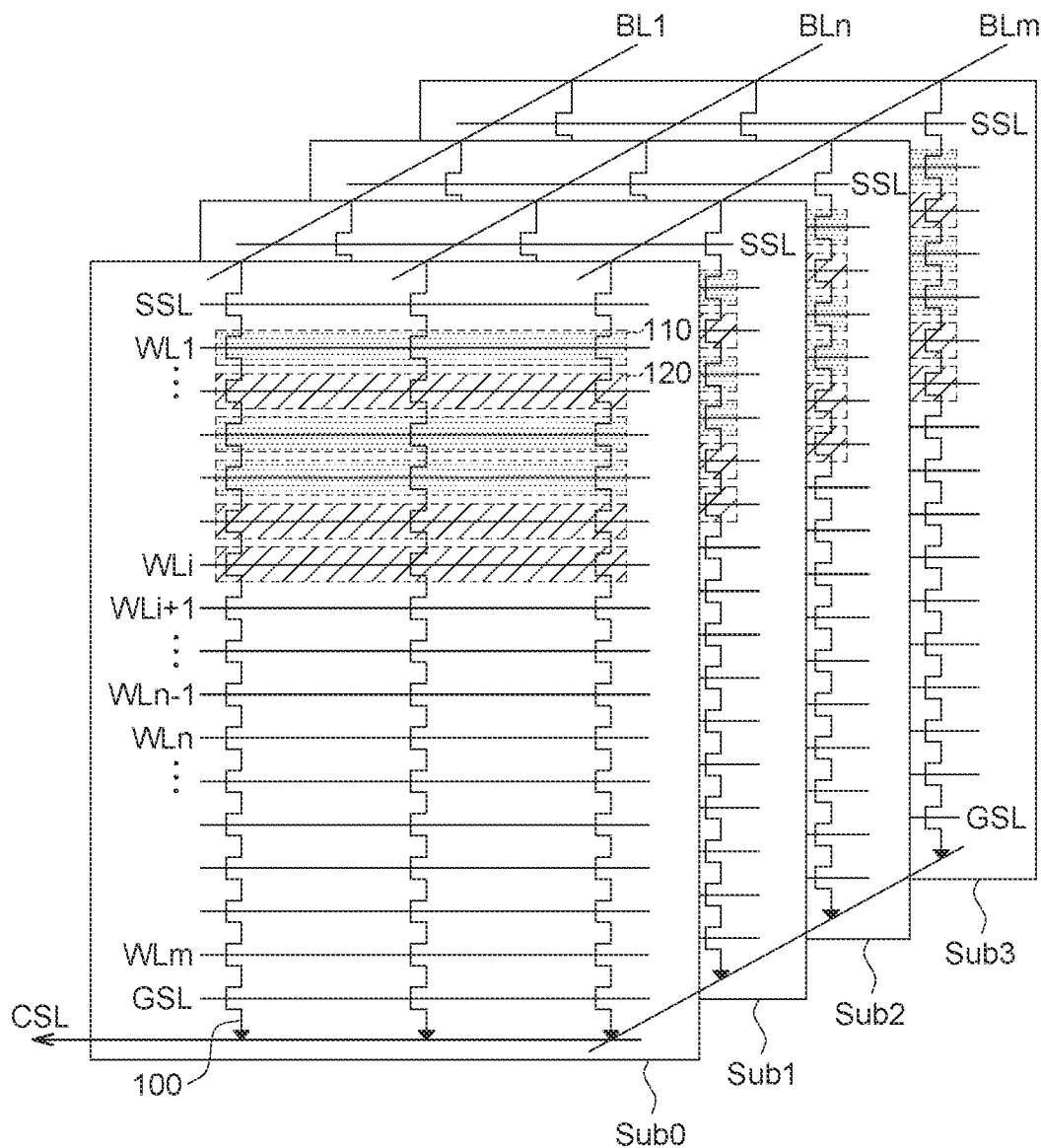
FIG. 3 illustrates an exemplary erase operation of a method for operating a memory device according to embodiments.

Referring to FIG. 3, another exemplary erase operation is illustrated. The selected sub-block Sub0 comprises a first group of word lines WL1 . . . WLi, a group of dummy word lines WLi+1 . . . WLn−1, and a second group of word lines WLn . . . WLm, the first group of word lines WL1 . . . WLi is between the string select line SSL and the group of dummy word lines WLi+1 . . . WLn−1, the second group of word lines WLn . . . WLm is between the ground select line GSL and the group of dummy word lines WLi+1 . . . WLn−1. In the block as shown in FIG. 3, only pages corresponding to the first group of word lines WL1 . . . WLi is to be erased. For example, the invalid pages are indicated by boxes 110 with dot shading, and the valid pages are indicated by boxes 120 with slash shading. The erase operation comprises: applying the switch voltage to the string select line SSL of the selected sub-block Sub0; applying the erase voltage to the ground select line GSL of the selected sub-block Sub0; applying the erase voltage to the second group of word lines WLn . . . WLm; applying gradient voltages from the erase voltage to the gate control voltage to the group of dummy word lines WLi+1 . . . WLn−1 from a side of the group of dummy word lines WLi+1 . . . WLn−1 close to the second group of word lines WLn . . . WLm to a side of the group of dummy word lines WLi+1 . . . WLn−1 close to the first group of word lines WL1 . . . WLi; and applying the gate control voltage to the first group of word lines WL1 . . . WLi. In addition, the erase operation comprises: applying the erase voltage to the bit lines BL1 . . . BLm and the common source line CSL of the selected sub-block Sub0; and applying the erase voltage to the string select lines and ground select lines of deselected sub-blocks Sub1, Sub2, and Sub3 of the block. Since the switch voltage is applied to the sub-block Sub0 from only the string select line side and the gradient voltages from the erase voltage to the gate control voltage are applied to the group of dummy word lines WLi+1 . . . WLn−1 to cut off the memory strings, only the pages corresponding to the first group of word lines WL1 . . . WLi are selected, and the erase operation can be performed on only these pages. At the same time, the erase voltage is applied at both sides of the pages corresponding to the second group of word lines WLn . . . WLm, and thus the pages corresponding to the second group of word lines WLn . . . WLm are not selected and will not be erased. In addition, the erase voltage is applied at both sides of the sub-blocks Sub1, Sub2, and Sub3, and thus the sub-blocks Sub1, Sub2, and Sub3 are not selected and will not be erased. As such, the erase operation can be performed on only a portion of a sub-block rather than the whole block. The number of the valid pages needed to be copied to a free block can be further reduced.

Figure 4:
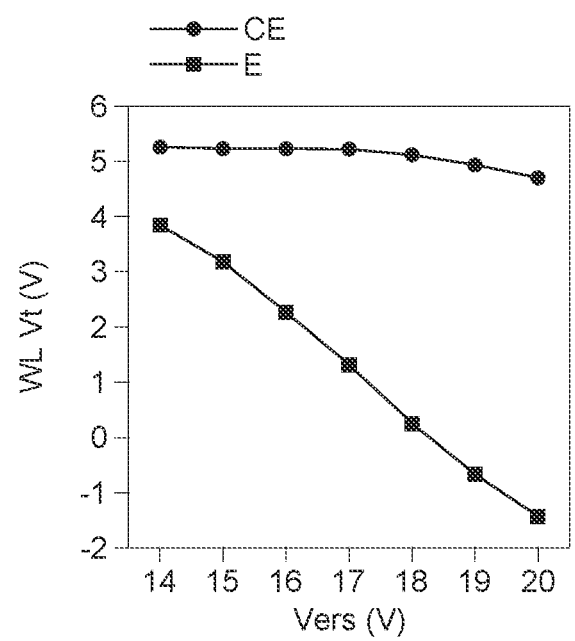
FIG. 4 shows an example and a comparative example of switch voltages for the case of FIG. 3.

According to some embodiments, the switch voltage is smaller than the erase voltage by 5 V to 15 V, such as by about 10V. Referring to FIG. 4, change of the threshold voltage of the first group of word lines WL1 . . . WLi (WL Vt) with the erase voltage (Vers) for different switch voltages are provided. In an example E, the switch voltage applied to a string select line SSL is Vera-9 V, i.e., the switch voltage is smaller than the erase voltage by 9 V. In a comparative example CE, the switch voltage applied to a string select line SSL is Vera-1 V, i.e., the switch voltage is smaller than the erase voltage by 1 V. When the erase voltage is 18V or more, the switch voltage being Vera-9 V can effectively make the threshold voltage of the first group of word line WL1 . . . WLi being 0 V, so as to select the pages corresponding the first group of word line WL1 . . . WLi. In contrast, the switch voltage being Vera-1 V will not make the threshold voltage of the first group of word line WL1 . . . WLi being 0 V. As such, it can be appreciated that the erase voltage (i.e., Vera-0 V) applied to the string select lines and ground select lines of deselected sub-blocks Sub1, Sub2, and Sub3 can make the sub-blocks Sub1, Sub2, and Sub3 not be selected. In some embodiments, the erase voltage may be about 20 V to 24 V, and the switch voltage may be about 5 V to 15 V. According to some embodiments, the gate control voltage is a zero voltage or a positive bias, the value of which is determined as needed.

Figure 5:
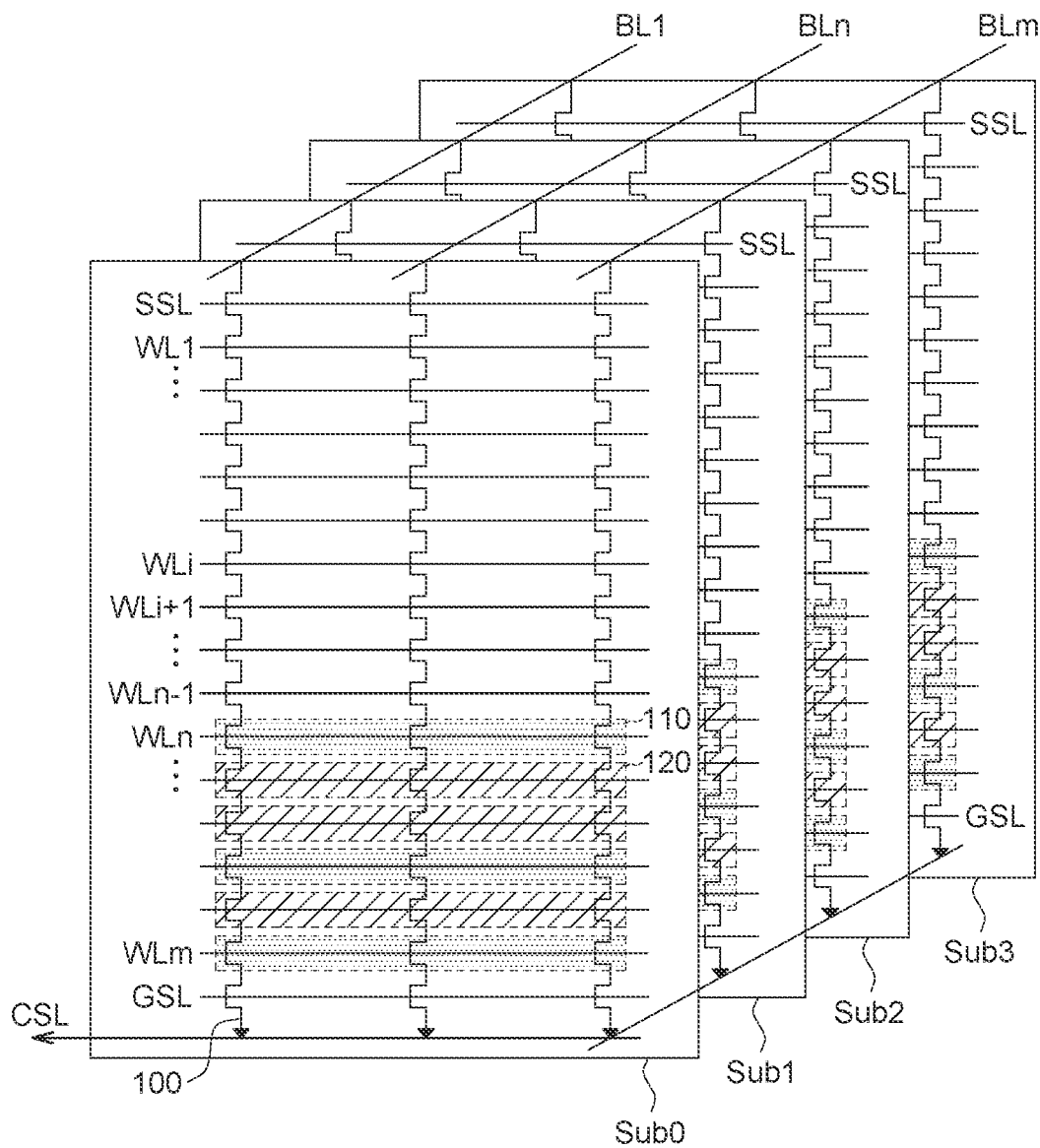
FIG. 5 illustrates an exemplary erase operation of a method for operating a memory device according to embodiments.

Referring to FIG. 5, still another exemplary erase operation is illustrated. The selected sub-block Sub0 comprises a first group of word lines WL1 . . . WLi, a group of dummy word lines WLi+1 . . . WLn−1, and a second group of word lines WLn . . . WLm, the first group of word lines WL1 . . . WLi is between the string select line SSL and the group of dummy word lines WLi+1 . . . WLn−1, the second group of word lines WLn . . . WLm is between the ground select line GSL and the group of dummy word lines WLi+1 . . . WLn−1. In the block as shown in FIG. 5, only pages corresponding to the second group of word lines WLn . . . WLm is to be erased. For example, the invalid pages are indicated by boxes 110 with dot shading, and the valid pages are indicated by boxes 120 with slash shading. The erase operation comprises: applying the switch voltage to the ground select line GSL of the selected sub-block Sub0; applying the erase voltage to the string select line SSL of the selected sub-block Sub0; applying the erase voltage to the first group of word lines WL1 . . . WLi; applying gradient voltages from the erase voltage to the gate control voltage to the group of dummy word lines WLi+1 . . . WLn−1 from a side of the group of dummy word lines WLi+1 . . . WLn−1 close to the first group of word lines WL1 . . . WLi to a side of the group of dummy word lines WLi+1 . . . WLn−1 close to the second group of word lines WLn . . . WLm; and applying the gate control voltage to the second group of word lines WLn . . . WLm. In addition, the erase operation comprises: applying the erase voltage to the bit lines BL1 . . . BLm and the common source line CSL of the selected sub-block Sub0; and applying the erase voltage to the string select lines and ground select lines of deselected sub-blocks Sub1, Sub2, and Sub3 of the block. Since the switch voltage is applied to the sub-block Sub0 from only the ground select line side and the gradient voltages from the erase voltage to the gate control voltage are applied to the group of dummy word lines WLi+1 . . . WLn−1 to cut off the memory strings, only the pages corresponding to the second group of word lines WLn . . . WLm are selected, and the erase operation can be performed on only these pages. At the same time, the erase voltage is applied at both sides of the pages corresponding to the first group of word lines WL1 . . . WLi, and thus the pages corresponding to the first group of word lines WL1 . . . WLi are not selected and will not be erased. In addition, the erase voltage is applied at both sides of the sub-blocks Sub1, Sub2, and Sub3, and thus the sub-blocks Sub1, Sub2, and Sub3 are not selected and will not be erased. As such, the erase operation can be performed on only a portion of a sub-block rather than the whole block. The number of the valid pages needed to be copied to a free block can be further reduced.

Figure 6:
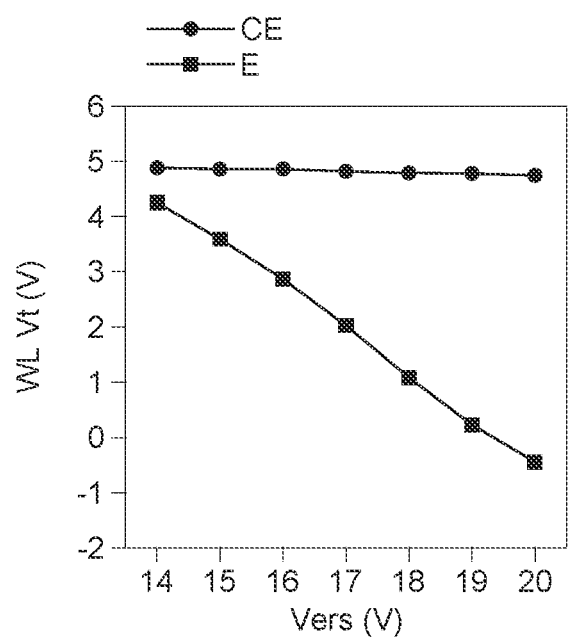
FIG. 6 shows an example and a comparative example of switch voltages for the case of FIG. 5.

According to some embodiments, the switch voltage is smaller than the erase voltage by 5 V to 15 V, such as by about 10V. Referring to FIG. 6, change of the threshold voltage of the second group of word lines WLn . . . WLm (WL Vt) with the erase voltage (Vers) for different switch voltages are provided. In an example E, the switch voltage applied to a ground select line GSL is Vera-9 V, i.e., the switch voltage is smaller than the erase voltage by 9 V. In a comparative example CE, the switch voltage applied to a ground select line GSL is Vera-1 V, i.e., the switch voltage is smaller than the erase voltage by 1 V. When the erase voltage is 18V or more, the switch voltage being Vera-9 V can effectively make the threshold voltage of the second group of word lines WLn . . . WLm being 0 V, so as to select the pages corresponding the second group of word lines WLn . . . WLm. In contrast, the switch voltage being Vera-1 V will not make the threshold voltage of the second group of word lines WLn . . . WLm being 0 V. As such, it can be appreciated that the erase voltage (i.e., Vera-0 V) applied to the string select lines and ground select lines of deselected sub-blocks Sub1, Sub2, and Sub3 can make the sub-blocks Sub1, Sub2, and Sub3 not be selected. In some embodiments, the erase voltage may be about 20 V to 24 V, and the switch voltage may be about 5 V to 15 V. According to some embodiments, the gate control voltage is a zero voltage or a positive bias, the value of which is determined as needed.

Figure 7:
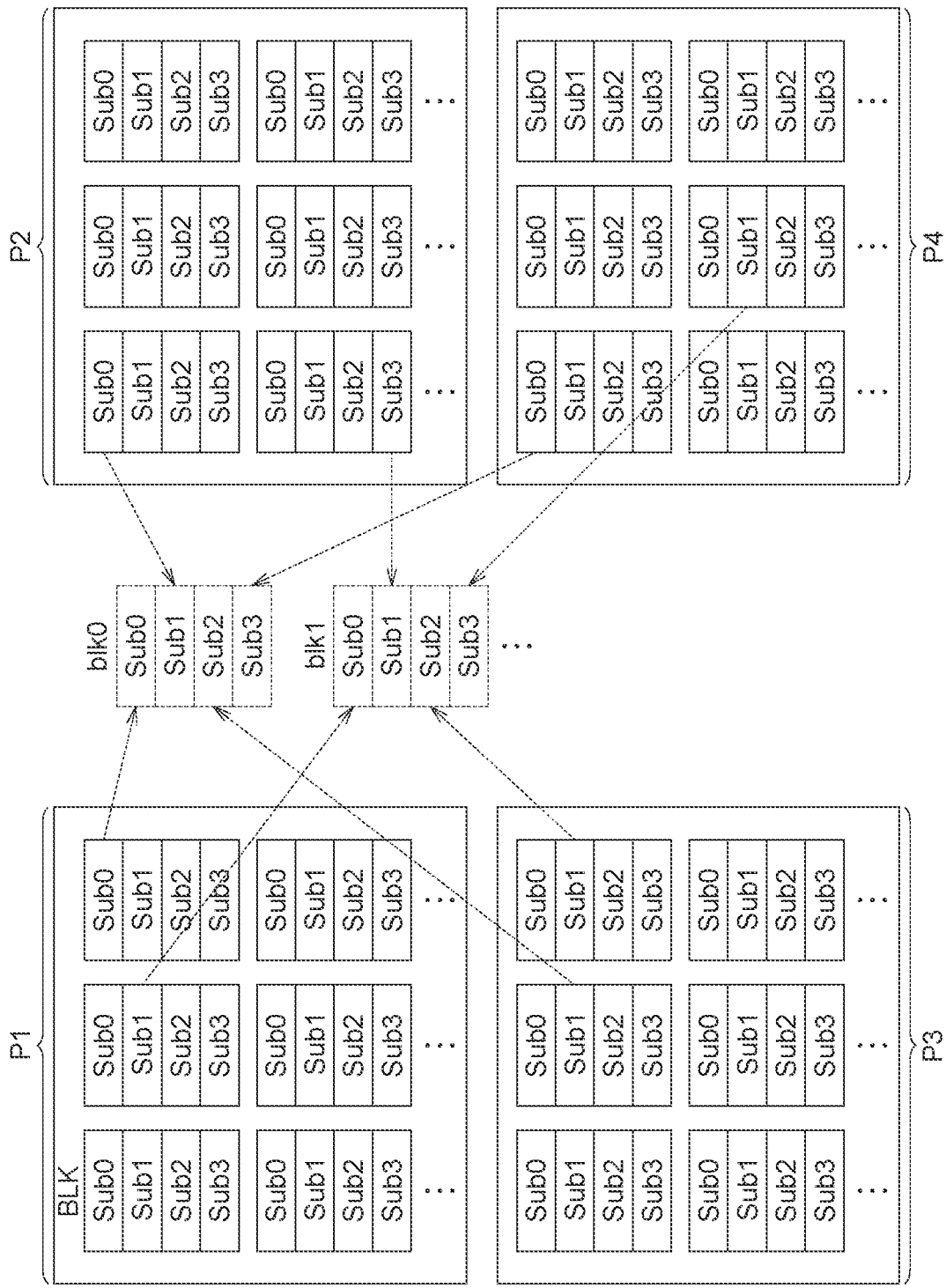
FIG. 7 illustrates an exemplary inter-plane mapping procedure of a method for operating a memory device according to embodiments.

In addition to the erase operation as described above, the method according to the disclosure may further comprise an inter-plane mapping procedure. The inter-plane mapping procedure comprises: mapping sub-blocks from physical blocks of different planes to a logical block such that the logical block is consisted of the sub-blocks from the different planes. Referring to FIG. 7, an exemplary inter-plane mapping procedure is illustrated. Sub-blocks Sub0, Sub1, Sub2, and/or Sub3 from physical blocks BLK of different planes P1 to P4 are mapped to logical blocks blk0, blk1, and the like, as indicated by arrows. The planes P1 to P4 have their own word line drivers and page buffers which can operate independently and simultaneously. As such, various operations can be performed on the logical block, in turn further decreasing the operation time and improving the performance of the memory device. According to some embodiments, a mapping relationship may be changed over time.

In some embodiments, the method according to the disclosure may comprise a read operation including the inter-plane mapping procedure, and the logical block is read. Similarly, in some embodiments, the method according to the disclosure may comprise a write operation including the inter-plane mapping procedure, and the logical block is written. In a conventional memory device, a physical block has only one word line driver, which is shared by all of the sub-blocks. The read operation and the write operation can only be performed on one sub-block, while other sub-blocks are inhibited. The sub-blocks within a physical block must be read or written sequentially. As the number of pages in a block increases, the access latency per block for the read and write I/O requests increases. With the inter-plane mapping procedure according to the disclosure, all of the sub-blocks Sub0, Sub1, Sub2, Sub3 in a logical block, such as the logical block blk0 or the like, can be read or written synchronously, thereby improving the read/write speed. As to the erase operation, the erase of a logical block can be done by performing a sub-block erase operation as described above in different planes at the same time.

In some embodiments, the method according to the disclosure may comprise a garbage collection process including the inter-plane mapping procedure and the erase operation according to the disclosure. With the inter-plane mapping procedure according to the disclosure, the read operation and the rewrite operation of the pages with valid data into a free block can be performed in-parallel, and thus be faster. With the erase operation according to the disclosure, the erase operation can be performed at a sub-block or even smaller level, and in some embodiments, the erase of a logical block can be done by performing the sub-block erase operation in different planes at the same time.

Based on the above, according to the disclosure, the erase operation can be performed at a sub-block or even smaller level, thereby improving the speed, write-amplification, and the like. The read and/or write operation may be accelerated. As such, various processes comprising the read, erase, and/or write operation, such as the garbage collection process, may also be improved. The performance and the reliability of the memory device can be improved.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory device, comprising:
a plurality of planes each comprising a plurality of blocks, wherein each of the blocks comprises sub-blocks, and each of the sub-blocks comprises:
a string select line;
a ground select line;
a plurality of word lines between the string select line and the ground select line;
a plurality of strings across the string select line, the word lines, and the ground select line;
a plurality of bit lines connected to the strings at a string select line side; and
a common source line connected to the strings at a ground select line side;
wherein the sub-blocks of a block share the bit lines, the word lines, and the common source line; and
wherein in an erase operation, a switch voltage is applied to at least one of the string select line or the ground select line of a selected sub-block of a selected block, a gate control voltage is applied to selected word lines of the selected sub-block, an erase voltage is applied to the bit lines and the common source line of the selected sub-block, and the erase voltage is applied to the string select lines and the ground select lines of deselected sub-blocks of the selected block, wherein the switch voltage is smaller than the erase voltage, and the gate control voltage is smaller than the switch voltage and the erase voltage.

2. The memory device according to claim 1, wherein in the erase operation, the whole selected sub-block is to be erased, and the switch voltage is applied to both the string select line and the ground select line of the selected sub-block.

3. The memory device according to claim 1, wherein the word lines of each of the sub-blocks comprises a first group of word lines and a second group of word lines separated from each other by a group of dummy word lines, the first group of word lines is between the string select line and the group of dummy word lines, and the second group of word lines is between the ground select line and the group of dummy word lines.

4. The memory device according to claim 3, wherein in the erase operation, only pages corresponding to the first group of word lines of the selected sub-block is to be erased, the switch voltage is applied to the string select line of the selected sub-block, the erase voltage is applied to the ground select line of the selected sub-block, the erase voltage is applied to the second group of word lines, gradient voltages from the erase voltage to the gate control voltage are applied to the group of dummy word lines from a side of the group of dummy word lines close to the second group of word lines to a side of the group of dummy word lines close to the first group of word lines, the gate control voltage is applied to the first group of word lines, and the erase voltage is applied to the string select lines and the ground select lines of deselected sub-blocks of the selected block.

5. The memory device according to claim 3, wherein in the erase operation, only pages corresponding to the second group of word lines of the selected sub-block is to be erased, the switch voltage is applied to the ground select line of the selected sub-block, the erase voltage is applied to the string select line of the selected sub-block, the erase voltage is applied to the first group of word lines, gradient voltages from the erase voltage to the gate control voltage are applied to the group of dummy word lines from a side of the group of dummy word lines close to the first group of word lines to a side of the group of dummy word lines close to the second group of word lines, the gate control voltage is applied to the second group of word lines, and the erase voltage is applied to the string select lines and the ground select lines of deselected sub-blocks of the selected block.

6. The memory device according to claim 1, wherein in an inter-plane mapping procedure, sub-blocks from physical blocks of different planes are mapped to a logical block such that the logical block is consisted of the sub-blocks from the different planes.

7. The memory device according to claim 6, wherein in a write operation, the inter-plane mapping procedure is performed, and the logical block is written.

8. The memory device according to claim 6, wherein in a read operation, the inter-plane mapping procedure is performed, and the logical block is read.

9. The memory device according to claim 6, wherein in a garbage collection process, the inter-plane mapping procedure and the erase operation are performed.

10. The memory device according to claim 1, wherein memory cells are defined at cross points of the word lines and the strings.

11. A method for operating a memory device, comprising:
an erase operation, comprising:
applying a switch voltage to at least one of a string select line or a ground select line of a selected sub-block of a block;
applying a gate control voltage to selected word lines of the selected sub-block;
applying an erase voltage to bit lines and a common source line of the selected sub-block; and
applying the erase voltage to string select lines and ground select lines of deselected sub-blocks of the block;
wherein the switch voltage is smaller than the erase voltage, and the gate control voltage is smaller than the switch voltage and the erase voltage.

12. The method according to claim 11, wherein in the block, the whole selected sub-block is to be erased, and the erase operation comprises:
applying the switch voltage to both the string select line and the ground select line of the selected sub-block.

13. The method according to claim 11, wherein the selected sub-block comprises a first group of word lines, a group of dummy word lines, and a second group of word lines, the first group of word lines is between the string select line and the group of dummy word lines, the second group of word lines is between the ground select line and the group of dummy word lines, and wherein in the block, only pages corresponding to the first group of word lines is to be erased, and the erase operation comprises:
applying the switch voltage to the string select line of the selected sub-block;
applying the erase voltage to the ground select line of the selected sub-block;
applying the erase voltage to the second group of word lines;
applying gradient voltages from the erase voltage to the gate control voltage to the group of dummy word lines from a side of the group of dummy word lines close to the second group of word lines to a side of the group of dummy word lines close to the first group of word lines;
applying the gate control voltage to the first group of word lines; and
applying the erase voltage to string select lines and ground select lines of deselected sub-blocks of the block.

14. The method according to claim 11, wherein the selected sub-block comprises a first group of word lines, a group of dummy word lines, and a second group of word lines, the first group of word lines is between the string select line and the group of dummy word lines, the second group of word lines is between the ground select line and the group of dummy word lines, and wherein in the block, only pages corresponding to the second group of word lines is to be erased, and the erase operation comprises:
applying the switch voltage to the ground select line of the selected sub-block;
applying the erase voltage to the string select line of the selected sub-block;
applying the erase voltage to the first group of word lines;
applying gradient voltages from the erase voltage to the gate control voltage to the group of dummy word lines from a side of the group of dummy word lines close to the first group of word lines to a side of the group of dummy word lines close to the second group of word lines;
applying the gate control voltage to the second group of word lines; and
applying the erase voltage to string select lines and ground select lines of deselected sub-blocks of the block.

15. The method according to claim 11, wherein the switch voltage is smaller than the erase voltage by 5 V to 15 V, and the gate control voltage is a zero voltage or a positive bias.

16. The method according to claim 11, further comprising:
an inter-plane mapping procedure, comprising:
mapping sub-blocks from physical blocks of different planes to a logical block such that the logical block is consisted of the sub-blocks from the different planes.

17. The method according to claim 16, wherein a mapping relationship is changed over time.

18. The method according to claim 16, comprising a write operation including the inter-plane mapping procedure, and the logical block is written.

19. The method according to claim 16, comprising a read operation including the inter-plane mapping procedure, and the logical block is read.

20. The method according to claim 16, comprising a garbage collection process including the inter-plane mapping procedure and the erase operation.

* * * * *